(12) United States Patent
Komori et al.

(10) Patent No.: US 11,963,297 B2
(45) Date of Patent: Apr. 16, 2024

(54) FLUORORESIN COMPOSITION, FLUORORESIN SHEET, LAMINATE AND SUBSTRATE FOR CIRCUITS

(71) Applicant: DAIKIN INDUSTRIES, LTD., Osaka (JP)

(72) Inventors: Hirokazu Komori, Osaka (JP); Hiroyuki Yoshimoto, Osaka (JP); Masaji Komori, Osaka (JP); Yuki Ueda, Osaka (JP); Junpei Terada, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 493 days.

(21) Appl. No.: 17/279,629

(22) PCT Filed: Dec. 24, 2019

(86) PCT No.: PCT/JP2019/050635
§ 371 (c)(1),
(2) Date: Mar. 25, 2021

(87) PCT Pub. No.: WO2020/145133
PCT Pub. Date: Jul. 16, 2020

(65) Prior Publication Data
US 2021/0345485 A1 Nov. 4, 2021

(30) Foreign Application Priority Data

Jan. 11, 2019 (JP) ................. 2019-003130

(51) Int. Cl.
| | | |
|---|---|---|
| H05K 1/03 | (2006.01) | |
| B32B 5/02 | (2006.01) | |
| B32B 15/082 | (2006.01) | |
| B32B 15/20 | (2006.01) | |
| B32B 17/10 | (2006.01) | |
| B32B 27/12 | (2006.01) | |
| B32B 27/20 | (2006.01) | |
| B32B 27/32 | (2006.01) | |
| C08F 214/26 | (2006.01) | |
| C08J 5/18 | (2006.01) | |
| C08K 3/36 | (2006.01) | |
| C08K 7/18 | (2006.01) | |

(52) U.S. Cl.
CPC ........... *H05K 1/0366* (2013.01); *B32B 5/022* (2013.01); *B32B 5/024* (2013.01); *B32B 15/082* (2013.01); *B32B 15/20* (2013.01); *B32B 17/10* (2013.01); *B32B 27/12* (2013.01); *B32B 27/20* (2013.01); *B32B 27/322* (2013.01); *C08F 214/262* (2013.01); *C08J 5/18* (2013.01); *C08K 3/36* (2013.01); *C08K 7/18* (2013.01); *B32B 2262/101* (2013.01); *B32B 2264/1021* (2020.08); *B32B 2457/08* (2013.01); *C08F 2800/10* (2013.01); *C08J 2327/18* (2013.01); *H05K 2201/015* (2013.01)

(58) Field of Classification Search
CPC .. H05K 1/0366; H05K 1/03; H05K 2201/015; H05K 1/0373; H05K 1/034; B32B 5/022; B32B 5/024; B32B 15/082; B32B 15/20; B32B 17/10; B32B 27/12; B32B 2264/1021; B32B 2262/101; B32B 2457/08; B32B 17/02; B32B 17/1055; B32B 27/20; B32B 2311/12; B32B 27/322; C08F 214/262; C08F 2800/10; C08F 214/26; C08F 214/28; C08F 216/1408; C08J 5/18; C08J 2327/18; C08K 3/36; C08K 7/18; C08K 2327/18; B29C 43/18; B29C 43/20; B29K 105/08; B29K 509/00; B29L 31/34; C08L 7/18
USPC .......................................... 428/236; 442/236
See application file for complete search history.

(56) References Cited

U.S. PATENT DOCUMENTS

| | | | |
|---|---|---|---|
| 36,396 | A | 9/1862 | Dunham, Jr. |
| 2006/0180936 | A1 | 8/2006 | Japp et al. |
| 2017/0231088 | A1 | 8/2017 | Akatuka et al. |
| 2018/0213637 | A1 | 7/2018 | Hosoda et al. |
| 2019/0141833 | A1 | 5/2019 | Hosoda et al. |
| 2021/0345485 | A1 | 11/2021 | Komori et al. |

FOREIGN PATENT DOCUMENTS

| | | |
|---|---|---|
| CN | 105462253 A | 4/2016 |
| CN | 106664806 A | 5/2017 |
| EP | 2 666 825 A | 11/2013 |

(Continued)

OTHER PUBLICATIONS

International Search Report for PCT/.JP2019/050635 dated Mar. 10, 2020 (PCT/ISA/210).
Office Action dated Apr. 11, 2023 from the Japanese Patent Office in counterpart JP Application No. 2022-063299.
International Preliminary Report on Patentability dated Jun. 16, 2021 with translation of the Written Opinion in International Application No. PCT/JP2019/050635.

(Continued)

*Primary Examiner* — Camie S Thompson
(74) *Attorney, Agent, or Firm* — Sughrue Mion, PLLC

(57) ABSTRACT

A fluororesin composition containing a melt moldable fluororesin and a silica, wherein the fluororesin has 25 or more carbonyl group-containing functional groups per $10^6$ main-chain carbon atoms; the silica is a spherical silica; and the fluororesin composition has a linear expansion coefficient of 100 ppm/° C. or lower. Also disclosed is a fluororesin sheet including the fluororesin composition, a laminate including a copper foil layer and a layer including the fluororesin composition and a substrate for circuits including a copper foil layer and a layer including the fluororesin composition.

13 Claims, No Drawings

(56) References Cited

FOREIGN PATENT DOCUMENTS

| | | | |
|---|---|---|---|
| EP | 3 213 904 A1 | | 9/2017 |
| JP | H0880539 | * | 3/1996 |
| JP | 2007-266606 A | | 10/2007 |
| JP | 2008-265069 A | | 11/2008 |
| JP | 2010-253729 A | | 11/2010 |
| JP | 2010-285523 A | | 12/2010 |
| JP | 2014-223799 A | | 12/2014 |
| JP | 2016-23294 A | | 2/2016 |
| JP | 2017-224758 A | | 12/2017 |
| JP | 7060825 B2 | | 4/2022 |
| TW | 201615064 A | | 4/2016 |
| WO | 2012/099132 A1 | | 7/2012 |
| WO | 2014/171554 A1 | | 10/2014 |
| WO | 2015/164296 A1 | | 10/2015 |
| WO | 2016/021666 A1 | | 2/2016 |
| WO | 2017/069217 A1 | | 4/2017 |
| WO | 2018/043682 A1 | | 3/2018 |
| WO | 2021/095662 A1 | | 5/2021 |

OTHER PUBLICATIONS

Communication dated Aug. 2, 2022, issued in counterpart Chinese Application No. 201980053297.9.
Extended European Search Report dated Aug. 29, 2022, issued in counterpart European Application No. 19909334.5.
Anonymous et al., "Fumed Silica—an overview | ScienceDirect Topics (Fillers-origin, chemical composition, properties, and morphology)", Handbook of Fillers, 4th edition, 2016, XP055950597, Retrieved from the Internet: URL:<https://www.sciencedirect.com/topics/engineering/fumed-silica> [retrieved on Aug. 10, 2022] (6 pages).
Communication dated Aug. 3, 2022, issued in counterpart Korean Application No. 10-2021-7006936.

* cited by examiner

FLUORORESIN COMPOSITION, FLUORORESIN SHEET, LAMINATE AND SUBSTRATE FOR CIRCUITS

CROSS REFERENCE TO RELATED APPLICATIONS

This application is a National Stage of International Application No. PCT/JP2019/050635 filed Dec. 24, 2019, claiming priority based on Japanese Patent Application No. 2019-003130 filed Jan. 11, 2019.

TECHNICAL FIELD

The present disclosure relates to a fluororesin composition, a fluororesin sheet, a laminate and a substrate for circuits.

BACKGROUND ART

In circuit boards, epoxy resins and polyimide resins are broadly used as insulating layers. In recent years, for high-frequency circuit boards used in applications in high-frequency regions on the level of several gigahertz, some proposes are made on constitutions forming an insulating layer of a fluororesin on a copper foil from the viewpoint of dielectric properties and hygroscopicity (Patent Literatures 1, 2 and 3).

Patent Literature 1 mainly discloses blending a polytetrafluoroethylene with silica particles in a high blending proportion.

Patent Literatures 2 and 3 describe making a substrate by combining a layer composed of a fluororesin with a copper foil, a glass nonwoven fabric or a glass cloth.

CITATION LIST

Patent Literature

Patent Literature 1: U.S. Reissue Pat. No. 36396
Patent Literature 2: Japanese Patent Laid-Open No. 2017-224758
Patent Literature 3: International Publication No. WO2016/021666

SUMMARY OF INVENTION

Technical Problem

The present disclosure has an object to provide a fluororesin composition which is melt moldable, low dielectric and has a low linear expansion coefficient and, even when the surface of a mating material is smooth, is excellent in adhesiveness.

Solution to Problem

The present disclosure is a fluororesin composition comprising a melt moldable fluororesin and a silica, wherein the fluororesin has 25 or more carbonyl group-containing functional groups per $10^6$ main-chain carbon atoms; the silica is a spherical silica; and the fluororesin composition has a linear expansion coefficient of 100 ppm/° C. or lower.

The melt moldable fluororesin is preferably a tetrafluoroethylene.perfluoro(alkyl vinyl ether) copolymer and/or a tetrafluoroethylene-hexafluoropropylene copolymer.

In the fluororesin composition, the blending ratio of the spherical silica to the total amount of the fluororesin and the silica is preferably higher than 40% by mass.

The present disclosure is also a fluororesin sheet comprising the above-mentioned fluororesin composition.

The present disclosure is also a laminate comprising a copper foil layer and a layer comprising the above-mentioned fluororesin composition.

The present disclosure is also a laminate comprising a fabric layer comprising glass fibers and the above layers.

In the above copper foil layers, Rz is preferably 2.0 µm or smaller.

The present disclosure is also a laminate comprising a layer comprising the fluororesin composition and a fabric layer comprising glass fibers.

The present invention is also a substrate for circuits comprising a copper foil layer and a layer comprising the fluororesin composition.

The present invention is also the substrate for circuits further comprising a fabric layer comprising glass fibers.

In the above copper foil layer, Rz is preferably 2.0 µm or smaller.

Advantageous Effects of Invention

The fluororesin composition of the present disclosure is low dielectric, has a low linear expansion coefficient and is excellent in adhesiveness. These features enable the reduction of the dielectric loss, the suppression of substrate warping, and the improvement of the heat cycle resistance. Since being capable of exhibiting good adhesiveness also to a copper foil with Rz of 2.0 µm or smaller and reducing the conductor loss as well, the fluororesin composition can further provide low-transmission loss circuit boards.

DESCRIPTION OF EMBODIMENTS

Hereinafter, the present disclosure will be described.

The present disclosure is a fluororesin composition comprising a melt moldable fluororesin and a silica, wherein the fluororesin has 25 or more carbonyl group-containing functional groups per $10^6$ main-chain carbon atoms; and the silica is a spherical silica.

The present disclosure uses the melt moldable fluororesin having 25 or more carbonyl group-containing functional groups per $10^6$ main-chain carbon atoms. The adhesiveness can thereby be improved. Further, by utilizing the spherical silica, the fluororesin composition can have better moldability and, due to high loading, can have a lower thermal expansion than in the case of utilization of crushed silica.

The melt moldable fluororesin has 25 or more carbonyl group-containing functional groups per $10^6$ main-chain carbon atoms. By making the fluororesin have the carbonyl group-containing functional groups in the above range, the adhesiveness of the fluororesin to a metal foil becomes better. The melt moldable fluororesin more preferably has 50 or more carbonyl group-containing functional groups per $10^6$ main-chain carbon atoms, still more preferably has 80 or more carbonyl group-containing functional groups per $10^6$ main-chain carbon atoms, and especially preferably has 100 or more carbonyl group-containing functional groups per $10^6$ main-chain carbon atoms. Then, the fluororesin has preferably 8,000 or less, more preferably 1,000 or less carbonyl group-containing functional groups per $10^6$ main-chain carbon atoms.

The number of the carbonyl group-containing functional groups can be calculated from infrared absorption spectra obtained by a Fourier transform infrared spectrometer.

A method of making the resin having the carbonyl group-containing functional groups in the above-mentioned proportion is not limited. The introduction of carbonyl groups to the fluororesin can be carried out by any known any method, such as a method of forming the carbonyl groups as terminals originated from an initiator, a method of using a monomer having a functional group to become a carbonyl group source as a third component monomer, or a method of binding a constituent unit having a carbonyl group to the fluororesin by a graft reaction.

A method of making the carbonyl group-containing functional groups in the above proportion range can be carried out by using the above-mentioned means singly or suitably in combination.

That is, the amount of the carbonyl group formed as terminals originated from the initiator can be a predetermined value by the selection, the amount to be blended, the adding method and the like of the initiator in polymerization. Also in the case of the other introducing methods, the amount of the carbonyl group can be a predetermined value by the amount to be used of the monomer having a functional group to become a carbonyl group source, the reaction amount of the graft reaction, and the like.

The present disclosure comprises the melt moldable fluororesin as an essential component.

The "melt moldable" means exhibiting melt flowability.

The "exhibiting melt flowability" means presence of temperatures at which MFR (Melt Flow Rate) is in the range of 0.1 to 1.000 g/10 min as measured under the conditions of a load of 5 kg at the temperatures equal to or higher than the melting point of the resin according to ASTM D3307.

The "melting point" means a temperature corresponding to the maximum value of the melting peak measured by differential scanning calorimetry (DSC).

The melt moldable fluororesin constituting a layer comprising the melt moldable fluororesin which forms one layer of the laminate of the present disclosure include various known melt moldable fluororesins, for example, tetrafluoroethylene-perfluoroalkyl vinyl ether copolymers (PFA), copolymers (CTFE copolymers) having a chlorotrifluoroethylene (CTFE) unit, tetrafluoroethylene-hexafluoropropylene copolymers (FEP), tetrafluoroethylene-ethylene copolymers (ETFE), polychlorotrifluoroethylene (PCTFE), chlorotrifluoroethylene-ethylene copolymers (ECTFE), polyvinylidene fluoride (PVDF) and polyvinyl fluoride (PVF), tetrafluoroethylene-hexafluoropropylene.vinylidene fluoride copolymers (THV) and tetrafluoroethylene-vinylidene fluoride copolymers.

Among these melt moldable fluororesins, preferable are tetrafluoroethylene-perfluoroalkyl vinyl ether copolymers (PFA) and tetrafluoroethylene-hexafluoropropylene copolymers (FEP).

Use of the above melt moldable fluororesin, since enabling carrying out melt molding, can suppress cost in terms of processing lower than in the case of using PTFE. Further, the use of the melt moldable fluororesin enables the improvement of adhesiveness when being adhered to a copper foil.

The melt moldable fluororesin may have a carbonyl group-containing functional group in its main chain skeleton. Examples of the carbonyl group-containing functional group include groups containing a carbonyl group(s) as a part of the chemical structure, such as a carbonate group, a carboxylic acid halide group (halogenoformyl group), a formyl group, a carboxyl group, an ester group (—C(=O)O—), an acid anhydride group (—C(=O)O—C(=O)—), an isocyanate group, an amido group, an imido group (—C(=O)—NH—C(=O)—), a urethane group (—NH—C(=O)O—), a carbamoyl group (NH$_2$—C(=O)—), a carbamoyloxy group (NH$_2$—C(=O)O—), an ureido group (NH$_2$—C(=O)—NH—) and an oxamoyl group (NH$_2$—C(=O)—C(=O)—). In an amido group, an imido group, a urethane group, a carbamoyl group, a carbamoyloxy group, a ureido group, an oxamoyl group and the like, a hydrogen atom(s) bonded to their nitrogen atom(s) may be substituted by a hydrocarbon group(s), for example, an alkyl group(s).

As the carbonyl group-containing functional group, because of excellent adhesiveness, preferable are at least one selected from the group consisting of a carboxyl group, an ester group and an isocyanate group; and among these, a carboxyl group is especially preferable.

In the PFA, the melting point is preferably 180 to 340° C., more preferably 230 to 330° C. and still more preferably 280 to 320° C. The melting point is a temperature corresponding to the maximum value in a heat-of-fusion curve when the temperature is raised at a rate of 10° C./min by using a differential scanning calorimeter (DSC).

The PFA is not limited, and preferable are copolymers having a molar ratio of a TFE unit and a PAVE unit (TFE unit/PAVE unit) of 70/30 or higher and lower than 99.5/0.5. The molar ratio thereof is more preferably 70/30 or higher and 98.9/1.1 or lower, still more preferably 80/20 or higher and 98.5/1.5 or lower. When the TFE unit is too low, the mechanical property is likely to decrease; and when too high, the melting point becomes too high and the moldability is likely to decrease. The PFA may be a copolymer composed of TFE and PAVE alone, or is preferably also a copolymer in which a monomer unit originated from a monomer copolymerizable with TFE and PAVE is 0.1 to 10% by mol, and the TFE unit and the PAVE unit account for in total 90 to 99.9% by mol. The monomer copolymerizable with TFE and PAVE includes HFP, vinyl monomers represented by $CZ_3Z_4=CZ_5(CF_2)_nZ_6$, wherein $Z_3$, $Z_4$ and $Z_5$ are the same or different and denote a hydrogen atom or a fluorine atom; $Z_6$ denotes a hydrogen atom a fluorine atom or a chlorine atom; and n denotes an integer of 2 to 10), and alkyl perfluorovinyl ether derivatives represented by $CF_2=CF$—$OCH_2$—$Rf_7$, wherein $Rf_7$ denotes a perfluoroalkyl group having 1 to 5 carbon atoms.

For the PFA, the melt flow rate (MFR) is preferably 0.1 to 100 g/10 min, more preferably 0.5 to 90 g/10 min and still more preferably 1.0 to 85 g/10 min. Here, in the present description, MFR is a value obtained by measurement under the conditions of a temperature of 372° C. and a load of 5.0 kg according to ASTM D3307.

The FEP is not limited, and preferable are copolymers having a molar ratio of a TFE unit and an HFP unit (TFE unit/HFP unit) of 70/30 or higher and lower than 99/1. The molar ratio thereof is more preferably 70/30 or higher and 98.9/1.1 or lower, and still more preferably 80/20 or higher and 97/3 or lower. When the TFE unit is too low, the mechanical property is likely to decrease; and when too high, the melting point becomes too high and the moldability is likely to decrease. The FEP is preferably also a copolymer in which a monomer unit originated from a monomer copolymerizable with TFE and HFP is 0.1 to 10% by mass, and the TFE unit and the HFP unit account for in total 90 to 99.9% by mol. The monomer copolymerizable with TFE and HFP include alkyl perfluorovinyl ether derivatives.

For the FEP, the melting point is preferably 150 to 320° C., more preferably 200 to 300° C. and still more preferably 240 to 280° C. The melting point is a temperature corresponding to the maximum value in a heat-of-fusion curve when the temperature is raised at a rate of 10° C./min by using a differential scanning calorimeter (DSC).

For the FEP, the MFR is preferably 0.01 to 100 g/10 min, more preferably 0.1 to 80 g/10 min, still more preferably 1 to 60 g/10 min and especially preferably 1 to 50 g/10 min.

Herein, the contents of each monomer unit constituting the fluororesin can be calculated by suitably combining NMR, FT-IR, elemental analysis and X-ray fluorescence analysis according to the types of the monomers.

The fluororesin composition of the present disclosure comprises the spherical silica particle. Thereby, the fluororesin composition is one whose flowability becomes good, and one whose molding becomes easy even when a large amount of the silica is blended.

The above spherical silica particle means one whose particle shape is near a perfect sphere; and specifically, the sphericity thereof is preferably 0.80 or higher, more preferably 0.85 or higher, still more preferably 0.90 or higher and most preferably 0.95 or higher. By taking a photograph by SEM and using the area and the perimeter of the particle observed therein, the sphericity is calculated as a value calculated by the following formula: (Sphericity)=$\{4\pi \times (area)/(perimeter)^2\}$. The shape of the particle approaches a perfect sphere as the sphericity approaches 1. With regard to the sphericity, specifically, the average value measured for 100 particles by using an image processing device (Spectris Co., Ltd., FPIA-3000) is adopted.

In the spherical silica particle to be used in the present disclosure, when the volume is cumulated in the order of smaller particle diameter, D90/D10 is preferably 2 or higher (desirably 2.3 or higher and further 2.5 or higher) and D50 is preferably 10 μm or smaller. Further, D90/D50 is preferably 1.5 or higher (further desirably 1.6 or higher). D50/D10 is preferably 1.5 or higher (further desirably 1.6 or higher). Since it is enabled for spherical silica particles having small particle diameters to enter gaps among spherical silica particles having large particle diameters, the loading properties can be excellent and the flowability can be high. It is preferable that particularly the particle size distribution has high frequencies on the small particle diameter as compared with Gaussian distribution. The particle diameter can be measured by a laser diffraction scattering type particle size distribution measurement apparatus. Then, the spherical silica particle is preferably one obtained by removing coarse particles having particle diameters equal to or larger than a predetermined particle diameter by a filter or the like.

In the spherical silica particle, the water absorbability is preferably 1.0% or lower and more preferably 0.5% or lower. The water absorbability is based on the mass of the silica particle in dryness. The measurement of the water absorbability is carried out by leaving a sample in a dry state at 40° C. and 80% RH for 1 hour and measuring and calculating moisture formed by heating at 200° C. by a Karl Fischer moisture measurement apparatus.

The above each parameter of the spherical silica particle can be measured also by using the above-mentioned methods after the fluororesin composition is heated at 600° C. for 30 min in the air atmosphere to thereby bake off the fluororesin, and taking out the spherical silica particle.

The silica powder of the present invention may be one having been subjected to a surface treatment. By previously subjecting the silica powder to the surface treatment, the agglomeration of the silica particles can be suppressed and the silica particles can well be dispersed in the resin composition.

The surface treatment is not limited, and any known treatment can be used. Specific examples thereof include treatments using a silane coupling agent which has a reactive functional group, such as epoxysilane, aminosilane, vinylsilane, acrylsilane, hydrophobic alkylsilanes, phenylsilane or fluorinated alkylsilanes, plasma treatments and fluorination treatments.

Examples of the silane coupling agent include epoxysilanes such as γ-glycidoxypropyltriethoxyethoxysilane and β-(3,4-epoxycyclohexyl)ethyltrimethoxysilane, aminosilanes such as aminopropyltriethoxysilane and N-phenylaminopropyltrimethoxysilane, vinylsilanes such as vinyltrimethoxysilane, and acrylsilanes such as acryloxytrimethoxysilane.

The spherical silica to be used may also be commercially available silica particles meeting the above-mentioned properties. Examples of the commercially available silica particles include a Denka fused silica, FB Grade (manufactured by Denka Co., Ltd.), a Denka fused silica, SFP Grade (manufactured by Denka Co., Ltd.), Excelica (manufactured by Tokuyama Corp.), a high-purity synthetic spherical silica, Admafine (manufactured by Admatechs Co., Ltd.), Admanano (manufactured by Admatechs Co., Ltd.), and Admafuse (manufactured by Admatechs Co., Ltd.).

In the fluororesin composition of the present disclosure, the linear expansion coefficient is 100 ppm/° C. or lower. In order to meet such a parameter, by suitably regulating the kind of the resin, the kind of the silica, the blending proportions and the like, the fluororesin composition meeting the above-mentioned values can be made.

In the present disclosure, the linear expansion coefficient is a value measured by a method described in Examples.

Here, "the linear expansion coefficient is 100 ppm/° C. or lower" means that when the linear expansion coefficient is measured by the measurement method described in Examples, the linear expansion coefficient is 100 ppm/° C. or lower in any direction of X/Y direction and Z direction.

Use of the fluororesin composition having such a low linear expansion coefficient is preferable in that the dimensional stability to heat is excellent.

The fluororesin sheet of the present disclosure, since having the linear expansion coefficient as described above and further a low dielectric loss tangent, can be used suitably in applications in the high-frequency region on a few tens of gigahertz level.

In the fluororesin composition of the present disclosure, the melt flow rate (MFR) is preferably 1.0 g/10 min or higher, more preferably 1.5 g/10 min or higher and still more preferably 2.0 g/10 min or higher. The upper limit of the MFR is not limited, and is, for example, 30 g/10 min.

The fluororesin composition having an MFR in the above range is preferable in that the heat processability such as melt extrusion moldability is excellent.

In the fluororesin composition of the present disclosure, the blend ratio of the spherical silica to the total amount of the fluororesin and the silica is preferably higher than 40% by mass. By making the blend ratio in the above range, the linear expansion coefficient and the moldability can be balanced and the case is preferable in that it is easy for the fluororesin composition having both the properties to be made.

The above proportion is preferably 50% by mass or higher and still more preferably 60% by mass or higher. The upper limit of the proportion is not limited, and is preferably 80% by mass or lower and still more preferably 70% by mass or lower.

The fluororesin composition of the present disclosure is a composition essentially comprising the melt moldable fluororesin and the silica, but may be one, as required, containing other additives in the ranges not adversely affecting physical properties.

The fluororesin composition of the present disclosure is not limited in the shape and form and the like, and is a composition essentially comprising the above-mentioned two components. A mixing method for obtaining such a composition is not limited, and the mixing can be carried out by a twin-screw extruder, a kneader, a mixer, a roll mill, a bead mill or the like.

The fluororesin composition of the present disclosure can be used especially suitably as an insulating material. Specifically, the fluororesin composition is made into a film shape or sheet shape and can be used for formation of insulativity.

The present disclosure is also a fluororesin sheet comprising the above-mentioned fluororesin composition. The fluororesin sheet of the present disclosure can be used as a sheet for printed wiring boards by being laminated with other base materials. In the fluororesin sheet of the present disclosure, the thickness is preferably 2.5 to 1,000 μm, more preferably 10 to 500 μm and still more preferably 25 to 150 μm.

A method for molding the fluororesin composition of the present disclosure into the fluororesin sheet is not limited, and examples thereof include a method of melt molding such as extrusion, and a cast method in which after a dispersion composed of a resin, silica and the like is prepared, the dispersion is applied and dried on a base material.

The fluororesin sheet may also be one whose one surface or both surfaces have been surface modified. Subjecting the fluororesin sheet to the surface modification is preferable in that the adhesiveness to a copper foil or a glass fabric layer is improved.

A specific method of the surface modification is not limited, and the surface modification can be carried out by a well-known any method. Specifically, there can be adopted corona discharge treatment or glow discharge treatment, plasma discharge treatment, or discharge treatment by sputtering or the like. The surface modification can be carried out, for example, in such a way that by introducing oxygen gas, nitrogen gas, hydrogen gas or the like in a discharge atmosphere, the surface free energy can be controlled; besides, by exposing a surface to be modified to an inert gas (for example, nitrogen gas, helium gas, argon gas or the like) containing organic compounds and applying a high-frequency voltage between electrodes to cause discharge, active species are produced on the surface, and then, a functional group of an organic compound is introduced or a polymerizable organic compound is graft polymerized.

The present disclosure is also a laminate in which a copper foil is adhered on one surface or both surfaces of the above-mentioned fluororesin sheet. As described above, the fluororesin composition of the present disclosure is excellent in adhesiveness. In the copper foil, Rz is preferably 2.0 μm or smaller. That is, the fluororesin composition of the present disclosure is excellent also in the adhesiveness to a copper foil having a high smoothness of an Rz of 2.0 μm or smaller. Further it suffices if Rz of at least the surface of the copper foil to be adhered to the above-mentioned fluororesin sheet is 2.0 μm or smaller, and the Rz value of the other surface is not limited.

In the copper foil, the thickness is not limited, and is preferably in the range of 5 to 50 μm and more preferably 9 to 35 μm.

The copper foil is not limited, and specific examples thereof include rolled copper foils and electrolytic copper foils.

The copper foil having an Rz of 2.0 μm or smaller is not limited, and commercially available ones can be used. Examples of the commercially available copper foils having an Rz of 2.0 μm or smaller include an electrolytic copper foil CF-T9DA-SV-18 (thickness: 18 μm/Rz: 0.85 μm) (manufactured by Fukuda Metal Foil & Powder Co., Ltd.).

The copper foil may be one having been subjected to surface treatment for enhancing the adhesive strength to the fluororesin sheet of the present disclosure.

The surface treatment is not limited, and is silane coupling treatment, plasma treatment, corona treatment, UV treatment, electron beam treatment or the like; a reactive functional group of a silane coupling agent is not limited, and is, from the viewpoint of the adhesiveness to a resin base material, preferably one having at least one selected from an amino group, a (meth)acryl group, a mercapto group and an epoxy group on its terminal. Further a hydrolyzable group is not limited, and includes alkoxy groups such as a methoxy group and an ethoxy group. The copper foil to be used in the present disclosure may be one having a rust preventive layer (an oxide film such as chromate, or the like), a heat resistant layer and the like formed thereon.

A surface-treated copper foil having a surface-treating layer by the above silane compound on the copper foil surface can be produced by preparing a solution containing the silane compound and thereafter, subjecting a copper foil to surface treatment by using the solution.

The copper foil, from the viewpoint of enhancing the adhesiveness to a resin base material, may also have a roughening-treating layer on the surface.

In the case where there is such a risk that the roughening treatment reduces the performance required in the present disclosure, roughening particles to be electrodeposited on the copper foil surface may be made a few, or the mode of no roughening treatment may also be used, according to needs.

Between the copper foil and the surface-treating layer, from the viewpoint of improving various properties, one or more layers selected from the group consisting of a heat resistance-treating layer, a rust prevention-treating layer and a chromate-treating layer may be provided. These layers may be a single layer or multiple layers.

In the laminate, the adhesive strength between the copper foil and the fluororesin sheet is preferably 8 N/cm or higher. By applying the method described above, such an adhesive strength can be materialized. By making the adhesive strength to be 9 N/cm or higher, further to be 10 N/cm or higher, the laminate can become a material to be suitably used as substrates for circuits.

The present disclosure is also a laminate having a fabric layer comprising glass fibers and a layer comprising the above-mentioned fluororesin composition. By making the laminate to have the fabric layer comprising glass fibers, the improvement of the mechanical properties and the reduction of the linear expansion coefficient in the X/Y direction can be expected.

The present disclosure is also a substrate for circuits having a fabric layer comprising glass fibers, a copper foil layer and a layer comprising the above-mentioned fluororesin composition. The present disclosure is also a substrate for circuits in which the above-mentioned fluororesin sheet is used as a part in the multilayer structure and serves as a layer comprising the fluororesin composition.

In the substrate for circuits, the lamination order of the fabric layer comprising glass fibers, the copper foil layer and the above-mentioned fluororesin sheet, and the production method are not limited; and the layer structures can be made according to the purposes. Examples thereof include a substrate for single-sided circuits of a fabric layer comprising glass fibers/a layer comprising the fluororesin sheet/a copper thin foil layer, and a substrate for double-sided circuits of a copper foil layer/a layer comprising the fluororesin sheet/a fabric layer comprising glass fibers/a layer comprising the fluororesin composition/a copper foil layer. The substrate can also be one, as required, having other layers.

The fabric layer comprising glass fibers is a layer comprising glass cloth, glass nonwoven fabric or the like.

As the glass cloth, commercially available one can be used; and the glass cloth is preferably one having been subjected to a silane coupling agent treatment for enhancing the affinity for the fluororesin. The material of the glass cloth includes E glass, C glass, A glass, S glass, D glass, NE glass and low-dielectric constant glass, but from the viewpoint of easy availability, E glass, S glass and NE glass are preferable. It does not matter whether the weave of the fibers is plain weave or twill weave. The thickness of the glass cloth is usually 5 to 90 µm, and preferably 10 to 75 µm, but it is preferable to use a glass cloth thinner than the fluororesin sheet to be used.

The substrate for circuits may be one using glass nonwoven fabric as the fabric layer comprising glass fibers. The glass nonwoven fabric is a glass fabric in which staple fibers of glass are bound with a small amount of a binder compound (a resin or an inorganic material), or the shape thereof is maintained by entangling the glass staple fibers without using any binder compound; and commercially available one can be used. The diameter of the glass staple fiber is preferably 0.5 to 30 µm and the length thereof is preferably 5 to 30 mm. Specific examples of the binder compound include resins such as epoxy resins, acryl resins, cellulose, polyvinyl alcohols and fluororesins, and inorganic materials such as silica compounds. The amount of the binder compound to be used is usually 3 to 15% by mass with respect to the glass staple fibers. The material of the glass staple fiber includes E glass, C glass, A glass, S glass, D glass, NE glass and low-dielectric constant glass. The thickness of the glass nonwoven fabric is usually 50 µm to 1,000 µm, and preferably 100 to 900 µm. Here, the thickness of the glass nonwoven fabric in the present application means a value measured according to JIS P8188:1998 by using a Digital Gauge DG-925 (load: 110 g, face diameter: 10 mm), manufactured by Ono Sokki Co., Ltd. The glass nonwoven fabric may be subjected to a silane coupling agent treatment for enhancing the affinity for the fluororesin.

Since many of the glass nonwoven fabrics have a very high void fraction of 80% or higher, it is preferable that a glass nonwoven fabric thicker than a sheet comprising the fluororesin is prepared and compressed under a pressure and used.

The fabric layer comprising glass fibers may be a layer in which a glass cloth and a glass nonwoven fabric are laminated. Thereby, the fabric layer can have suitable properties by the combination of mutual properties.

The fabric layer comprising glass fibers may be in a state of a prepreg impregnated with a resin.

In the laminate, the fabric layer comprising glass fibers and the layer comprising the fluororesin composition may be adhered with each other at their interface; and the fabric layer comprising glass fibers may be impregnated with a part or the whole of the layer comprising the fluororesin composition.

Further the laminate may be a prepreg fabricated by impregnating a fabric comprising glass fibers with a fluororesin composition. The laminate may be one in which on the prepreg thus obtained, a resin layer comprising the fluororesin composition of the present disclosure is formed. In this case, the fluororesin composition used for the fabrication of the prepreg is not limited, and the fluororesin composition of the present disclosure can also be used.

A method for obtaining the laminate having the fabric layer comprising glass fibers and the layer comprising the above-mentioned fluororesin composition is not limited, and examples thereof include the following two methods.

(i) A method in which by using the fabric layer comprising glass fibers and a previously molded sheet comprising the fluororesin composition, lamination is carried out by a roll-to-roll process or by applying a pressure under heating by a press machine.

(ii) A method in which the fabric layer comprising glass fibers and a melt of the fluororesin composition extruded through a die or the like are passed between two rolls under pressure to be thereby composited.

Then, by subjecting the sheet comprising the fluororesin composition described in the above (i) or the laminate produced by the method of (i) or (ii) to a surface treatment, the adhesiveness to other layers can also be improved.

The present disclosure is also a laminate having a copper foil layer, a fabric layer comprising glass fibers, and a layer comprising the above-mentioned fluororesin composition.

A method of compositing the copper foil, the fabric layer comprising glass fibers and the layer comprising the fluororesin composition is not limited, and examples thereof include the following three methods.

(i) A method in which by using the copper foil, the fabric layer comprising glass fibers and a previously molded sheet comprising the fluororesin composition, lamination is carried out by a roll-to-roll process or by applying a pressure under heating by a press machine.

(ii) A method in which the fabric layer comprising glass fibers and a melt of the fluororesin composition extruded through a die or the like are passed between two rolls under pressure to be thereby composited, and thereafter, the composite is pressure bonded with the copper foil under heating.

(iii) A method in which a laminate in which a layer comprising the fluororesin composition is adhered on one surface of the copper foil is produced, and laminated with the fabric layer comprising glass fibers under heating and under pressure.

The methods may be methods in which a surface treatment is carried out, in the case of the method of the above (i), on the sheet comprising the fluororesin composition, and in the case of the method of the above (ii), on the laminate, and thereafter, the resultant is adhered to other layers such as a copper foil.

In the laminate, the lamination order of the copper foil layer, the fabric layer comprising glass fibers and the layer comprising the above-mentioned fluororesin composition, and the production method are not limited; and the layer structures can be made according to the purposes.

The lamination order specifically includes a structure of a fabric layer comprising glass fibers/a layer comprising the fluororesin composition/a copper foil layer, and a structure of a copper foil layer/a layer comprising the fluororesin composition/a fabric layer comprising glass fibers/a layer comprising the fluororesin composition/a copper foil layer. The laminate can also be one, as required, having other layers.

Here, as the copper foil in the above laminate, the same copper foil as described in detail in the above-mentioned laminate with the fluororesin sheet can be used.

In preparation of the above-mentioned structures of the laminates, the layer comprising the fluororesin composition of the present disclosure is to be used by being adhered to a copper foil on one surface or both surfaces thereof. As described above, the fluororesin composition of the present disclosure is excellent in the adhesiveness. Therefore, the adhesiveness to a copper foil having a high smoothness of an Rz of 2.0 μm or smaller is also excellent.

Copper foils to be used for substrates for circuits conventionally have certain irregularities imparted on their surface for securing the adhesiveness with insulating layers. When in high-frequency applications, irregularities are present on the surface of copper foils, however, the case is not preferable because of causing loss of electric signals. The above laminate can provide suitable adhesiveness also to copper foils having high smoothness, thereby becoming a material which can suitably be used as a substrate for circuits.

The present disclosure provides the fluororesin composition being good in processability and adhesiveness and providing good properties in all of the linear expansion and the dielectric properties, and the fluororesin sheet and the laminate utilizing the same.

In the present disclosure, high-frequency circuits include not only circuits to simply transmit high-frequency signals only, but also transmission lines to transmit signals which are not high-frequency signals, and circuits juxtaposed on the same plane, such as transmission lines to convert high-frequency signals to low-frequency signals and output the produced low-frequency signals to the outside, and transmission lines to supply power sources to be supplied for actuating high-frequency-ready components. The present disclosure can also be utilized for circuit boards for antennas and filters.

EXAMPLES

Hereinafter, the present disclosure will be described specifically based on Examples. First, raw materials used will be described below.
(Polymer Compositions)
Polymer compositions were measured by $^{19}$F-NMR analysis.
(The Number of Carbonyl Group-Containing Functional Groups)
A sample was compression molded at 350° C. to thereby fabricate a film of 0.25 to 0.3 mm in thickness. The film was analyzed by a Fourier transform infrared spectrometer [FT-IR](trade name: 1760X type, manufactured by PerkinElmer, Inc.) to obtain an infrared absorption spectrum to thereby obtain a difference spectrum from a base spectrum of a completely fluorinated polymer composition. From the absorption peak of a carbonyl group emerging in this difference spectrum, the number N of carbonyl group-containing functional groups per $1 \times 10^6$ carbon atoms in the sample was calculated according to the following expression.

$$N = I \times K / t$$

I: absorbance
K: correction factor
t: thickness of the film (mm)
For reference, for a carboxyl group, which is one of carbonyl group-containing functional groups, the absorption frequency, the molar absorptivity and the correction factor are shown below. Here, the molar absorptivity was one determined from FT-IR measurement data of a low-molecular model compound.

TABLE 1

| | Absorption Frequency (cm$^{-1}$) | Molar Absorptivity (l/cm/mol) | Correction Factor | Model Compound |
|---|---|---|---|---|
| COOH (free) | 1815 | 530.0 | 439 | H (CF$_2$)$_6$COOH |
| COOH (bonded) | 1779 | 530.0 | 439 | H (CF$_2$)$_6$COOH |

(The Melt Flow Rate (MFR))
The melt flow rate was measured according to ASTM D3307 under the condition of a temperature of 372° C. and a load of 5.0 kg.
(The Two-Dimensional Roughness Rz of a Copper Foil Surface)
As the two-dimensional roughness Rz of a copper foil surface, the catalog value of an electrolytic copper foil CF-T9DA-SV-18 (thickness: 18 μm, Rz: 0.85 μm) (manufactured by Fukuda Metal Foil & Powder Co., Ltd) was adopted.
(The Thickness of a Fluororesin Sheet)
The thickness of a fluororesin sheet was measured by using a micrometer gauge.
(The Adhesive Strength Between a Copper Foil and a Fluororesin Sheet)
A copper foil/a fluororesin sheet/a copper foil, or a copper foil/a fluororesin sheet/a fabric layer composed of glass fibers/a fluororesin sheet/a copper foil were stacked in order and vacuum heat pressed to thereby fabricate a laminate. The laminate was cut into a 10-mm width; one surface thereof was pasted with a pressure-sensitive adhesive tape on an aluminum plate; and when the copper foil was being peeled off in the direction of 90° against the plane of the laminate at a rate of 50 mm/min by a tensile testing machine, the peeling strength of the copper foil was measured and an obtained value was taken as the adhesive strength.
(The Relative Dielectric Constant and the Dielectric Loss Tangent of a Laminate Having a Fluororesin Sheet, a Fabric Layer Composed of Glass Fibers and a Layer Composed of a Fluororesin Composition)
The relative dielectric constant and the dielectric loss tangent were determined by being measured at 12 GHz by a cavity resonator (manufactured by KANTO Electronic Application and Development Inc.) and analyzing the measurement by a network analyzer (manufactured by Agilent Technologies, Inc.)
(The Linear Expansion Coefficient of an Insulating Layer)
The linear expansion coefficient was measured by a thermomechanical analyzer (TMA/SS6100, manufactured by SII Nanotechnology Inc.). Here, the linear expansion coefficient was a value measured in the temperature range of 25° C. to 160° C. The measurement in the X/Y axis direction was carried out in a tensile mode; and in the Z axis direction, a compression mode.

Example 1

A sheet obtained by melt extruding a PFA resin (composition: TFE/PPVE=97.9/2.1 (in molar ratio), MFR: 29.9 g/10 min, melting point: 297° C., the number of carboxyl groups: 80 per $10^6$ main-chain carbon atoms), and an electrolytic copper foil CF-T9DA-SV-18 (thickness: 18 μm, Rz: 0.85 μm) (manufactured by Fukuda Metal Foil & Powder Co., Ltd.) were heat pressed and thereby adhered by using a vacuum heat pressing machine (model number: MKP-1000HVWH-S7, manufactured by Mikado Technos Co., Ltd.) at a pressing temperature of 320° C., for a preheating time of 60 sec, at an applied pressure of 1.5 MPa and for a pressurizing time of 600 sec to thereby obtain a laminate. The adhesive strength of the obtained laminate was measured by the above method.

Comparative Example 1

A laminate was fabricated by the same method as in Example 1, except for altering the kind of a fluororesin to a PFA (a TFE/PPVE copolymer, composition: TFE/PPVE=98.5/1.5 (in molar ratio), MFR: 14.8 g/10 min, melting point: 305° C., the number of carboxyl groups: 21 per $10^6$ main-chain carbon atoms). Then, the adhesive strength was measured.

Comparative Example 2

A laminate was fabricated by the same method as in Example 1, except for altering the kind of a fluororesin to a PFA (a TFE/PPVE copolymer, composition: TFE/PPVE=98.5/1.5 (in molar ratio), MFR: 2.2 g/10 min, melting point: 307° C., the number of carboxyl groups: 9 per $10^6$ main-chain carbon atoms). Then, the adhesive strength was measured.

The results are shown in Table 1.

TABLE 2

|  | Number of Carboxyl Group (groups/$10^6$ carbon atoms) | Adhesive Strength (N/cm) |
|---|---|---|
| Example 1 | 80 | unpeelable |
| Comparative Example 1 | 21 | 5.6 |
| Comparative Example 2 | 9 | 1.5 |

From the results of Table 2, it is clear that by using a fluororesin having 25 or more carboxyl groups per $10^6$ main-chain carbon atoms, the adhesive strength was remarkably improved.

Test Examples 1 to 4

A PFA resin (composition: TFE/PPVE=97.9/2.1 (in molar ratio), MFR: 29.9 g/10 min, melting point: 297° C., the number of carboxyl groups: 80 per $10^6$ main-chain carbon atoms) was melt kneaded with a spherical silica (FE920GSQ, manufactured by Admatechs Co., Ltd., value at a 50% cumulative volume (D50): 5.9 μm, sphericity: 0.90) in blending proportions indicated in Table 3 by using a Laboplastomill (model number: 100C100, manufactured by Toyo Seiki Seisaku-sho Ltd.) to thereby obtain fluororesin compositions. Then, the melt flow rate (MFR) of the obtained fluororesin compositions was measured. The results are shown in Table 3.

Comparative Examples 3 to 6

Resin compositions were prepared wholly similarly, except for altering silica to a crushed silica (WX, manufactured by Tatsumori Ltd., value at a 50% cumulative volume (D50): 1.7 μm). Then, MFR thereof was measured. The results are shown in Table 3.

TABLE 3

|  | Test Example 1 | Test Example 2 | Test Example 3 | Test Example 4 | Comparative Example 3 | Comparative Example 4 | Comparative Example 5 | Comparative Example 6 |
|---|---|---|---|---|---|---|---|---|
| Kind of Silica | spherical silica | | | | crushed silica | | | |
| Silica Loading (wt %) | 30 | 40 | 50 | 60 | 30 | 40 | 50 | 60 |
| MFR (g/10 min) | 12.7 | 9.0 | 5.1 | 2.1 | 5.7 | 1.5 | unmeasurable | unmeasurable |

From the results of Table 3, it is clear that in the case of using the spherical silica, suitable MFR values were exhibited even when the loading thereof was very high, and the moldability was good.

(Production of Fluororesin Sheets)

Fluororesin sheets having a thickness indicated in Table 3 were produced from the compositions of Test Examples 3 and 4 by a vacuum heat pressing machine (model number: MKP-1000HVWH-S7, manufactured by Mikado Technos Co., Ltd.) (Examples 2 and 3), respectively.

These fluororesin sheets and an electrolytic copper foil CF-T9DA-SV-18 (thickness: 18 μm, Rz: 0.85 μm) (manufactured by Fukuda Metal Foil & Powder Co., Ltd.) were heat pressed and thereby adhered by using a vacuum heat pressing machine (model number: MKP-1000HVWH-S7, manufactured by Mikado Technos Co., Ltd.) at a pressing temperature of 320° C., for a preheating time of 60 sec, at an applied pressure of 1.5 MPa and for a pressurizing time of 600 sec to thereby obtain laminates having a copper foil layer and a layer composed of a fluororesin composition, respectively.

The obtained fluororesin sheets and laminates of Examples 2 and 3 were evaluated by the above methods. The results are shown in Table 4.

TABLE 4

|  |  | Example 2 Test Example 3 | Example 3 Test Example 4 |
|---|---|---|---|
| Silica Loading | wt % | 50 | 60 |
| Thickness | mm | 0.520 | 0.561 |
| Dielectric Properties | Relative Dielectric Constant | 2.81 | 3.01 |
|  | Dielectric Loss Tangent | 0.0009 | 0.0013 |

TABLE 4-continued

|  |  |  | Example 2 Test Example 3 | Example 3 Test Example 4 |
|---|---|---|---|---|
| Linear Expansion Coefficient | X/Y Axis Direction | ppm/° C. | 84 | 45 |
|  | Z Axis Direction | ppm/° C. | 53 | 33 |
| Adhesive Strength |  | N/cm | 9.0 | 8.2 |

From the results of Table 4, the laminates of the present disclosure could be made to be the ones having the dielectric properties, the adhesive strength and the linear expansion coefficient on practically usable levels.

Two sheets of film of 25 μm in thickness obtained by melt extruding a PFA resin (composition: TFE/PPVE=97.9/2.1 (in molar ratio), MFR: 29.9 g/10 min, melting point: 297° C., the number of carboxyl groups: 80 per $10^6$ main-chain carbon atoms) were disposed on both sides of a glass cloth, and heat pressed by using a vacuum heat pressing machine (model number: MKP-1000HVWH-S7, manufactured by Mikado Technos Co., Ltd.) at a pressing temperature of 320° C., for a preheating time of 60 sec, at an applied pressure of 1.5 MPa and for a pressurizing time of 600 sec to thereby obtain a prepreg impregnated with the PFA resin ((A) a fabric layer composed of glass fibers).

Then, the prepreg ((A) the fabric layer composed of glass fibers) and the fluororesin sheet fabricated in Example 2 ((B) a layer composed of the fluororesin composition) were heat pressed and thereby adhered by using a vacuum heat pressing machine (model number: MKP-1000HVWH-S7, manufactured by Mikado Technos Co., Ltd.) at a pressing temperature of 320° C., for a preheating time of 60 sec, at an applied pressure of 1.5 MPa and for a pressurizing time of 600 sec to thereby obtain a laminate having the fabric layer composed of glass fibers and a layer composed of the fluororesin composition.

Further, the prepreg ((A) the fabric layer composed of glass fibers), the fluororesin sheet fabricated in Example 2 ((B) a layer composed of the fluororesin composition) and an electrolytic copper foil CF-T9DA-SV-18 (thickness: 18 μm, Rz: 0.85 μm) (manufactured by Fukuda Metal Foil & Powder Co., Ltd.) were heat pressed and thereby adhered by using a vacuum heat pressing machine (model number: MKP-1000HVWH-S7, manufactured by Mikado Technos Co., Ltd.) at a pressing temperature of 320° C., for a preheating time of 60 sec, at an applied pressure of 1.5 MPa and for a pressurizing time of 600 sec to thereby obtain a laminate having the fabric layer composed of glass fibers, a layer composed of the fluororesin composition and a copper foil layer.

The each obtained laminate was evaluated by the above-mentioned methods. The results are shown in Table 5.

TABLE 5

| (A) Layer Comprising Fluororesin Composition | Silica Loading | wt % | 50 |
|---|---|---|---|
|  | Thickness | mm | 0.234 |
| (B) Fabric Layer Comprising Glass Fibers | Thickness | mm | 0.0092 |

TABLE 5-continued

| (A)/(B)/(A) Structure Dielectric Properties | Thickness | mm | 0.560 |
|---|---|---|---|
|  | Relative Dielectric Constant | — | 3.04 |
|  | Dielectric Loss Tangent | — | 0.0018 |
| Linear Expansion Coefficient | X/Y Axis Direction | ppm/° C. | 39 |
|  | Z Axis Direction | ppm/° C. | 134 |
| Adhesive Strength |  | N/cm | 9.2 |

From the results of Table 5, the laminates of the present disclosure had the dielectric properties and the adhesive strength on the practical levels; by incorporating the fabric layer composed of glass fibers, the linear expansion coefficient in the XY direction could be more reduced than in the laminate of Example 2, and due to the improvement of the dimensional accuracy in the XY direction, generation of warping and the like in formation of circuits could more effectively be suppressed.

Synthetically seeing the above experimental results, the fluororesin sheet composed of the fluororesin composition of the present disclosure has the performance balanced in all properties such as the adhesiveness, the molding processability, the dielectric properties and the linear expansion coefficient. Thereby, the fluororesin sheet has such an advantage that the adhesion thereof to copper foils having a high smoothness can be carried out, which has been conventionally difficult, while the resin properties are maintained.

INDUSTRIAL APPLICABILITY

The fluororesin composition of the present disclosure can suitably be used as a material for circuit boards.

The invention claimed is:
1. A fluororesin composition, comprising: a melt moldable fluororesin; and a silica,
   wherein the fluororesin has 25 or more carbonyl group-containing functional groups per $10^6$ main-chain carbon atoms;
   the silica is a spherical silica; and
   the fluororesin composition has a linear expansion coefficient of 100 ppm/° C. or lower.
2. The fluororesin composition according to claim 1, wherein the melt moldable fluororesin is a tetrafluoroethyleneperfluoro(alkyl vinyl ether) copolymer and/or a tetrafluoroethylene-hexafluoropropylene copolymer.
3. The fluororesin composition according to claim 1, wherein a blending ratio of the spherical silica to a total amount of the fluororesin and the silica is higher than 40% by mass.
4. A fluororesin sheet, comprising the fluororesin composition according to claim 1.
5. A laminate, comprising a base material and the fluororesin sheet according to claim 4.
6. A substrate for circuits, comprising the fluororesin sheet according to claim 4 used as a part in the multilayer structure.
7. A laminate, comprising a copper foil layer and a layer comprising the fluororesin composition according to claim 1.
8. A laminate, comprising a fabric layer comprising glass fibers and the layer according to claim 7.
9. The laminate according to claim 7, wherein the copper foil layer has an Rz of 2.0 μm or smaller.

10. A laminate, comprising a layer comprising the fluororesin composition according to claim 1 and a fabric layer comprising glass fibers.

11. A substrate for circuits, comprising a copper foil layer and a layer comprising the fluororesin composition according to claim 1.

12. The substrate for circuits according to claim 11, further comprising a fabric layer comprising glass fibers.

13. The substrate for circuits according to claim 11, wherein the copper foil layer has an Rz of 2.0 μm or smaller.

* * * * *

UNITED STATES PATENT AND TRADEMARK OFFICE
CERTIFICATE OF CORRECTION

| | |
|---|---|
| PATENT NO. | : 11,963,297 B2 |
| APPLICATION NO. | : 17/279629 |
| DATED | : April 16, 2024 |
| INVENTOR(S) | : Hirokazu Komori et al. |

Page 1 of 2

It is certified that error appears in the above-identified patent and that said Letters Patent is hereby corrected as shown below:

On the Title Page

Right column, item (56):
Delete "(56) References Cited

U.S. PATENT DOCUMENTS

| | | |
|---|---|---|
| 36,396 A | 9/1862 | Dunham,Jr. |
| 2006/0180936 A | 18/2006 | Japp et al. |
| 2017/0231088 A | 18/2017 | Akatuka et al. |
| 2018/0213637 A1 | 7/2018 | Hosoda et al. |
| 2019/0141833 A1 | 5/2019 | Hosoda et al. |
| 2021/0345485 A1 | 11/2021 | Komori et al. |

FOREIGN PATENT DOCUMENTS

| | | |
|---|---|---|
| CN | 105462253 A | 4/2016 |
| CN | 106664806 A | 5/2017 |
| EP | 2 666 825 A | 11/2013 |

(Continued)

OTHER PUBLICATIONS

International Search Report for PCT/.JP2019/050635 dated Mar. 10, 2020 (PCT/ISA/210).
Office Action dated Apr. 11, 2023 from the Japanese Patent Office in counterpart JP Application No. 2022-063299.
International Preliminary Report on Patentability dated Jun. 16, 2021 with translation of the Written Opinion in International Application No.PCT/JP2019/050635.
(Continued)"

Signed and Sealed this
Fourteenth Day of May, 2024

Katherine Kelly Vidal
*Director of the United States Patent and Trademark Office*

Insert --(56) References Cited

U.S. PATENT DOCUMENTS

| | | |
|---|---|---|
| 36,396 E | 11/1999 | Arthur et al. |
| 2006/0180936 A1 | 8/2006 | Japp et al. |
| 2017/0231088 A1 | 8/2017 | Akatuka et al. |
| 2018/0213637 A1 | 7/2018 | Hosoda et al. |
| 2019/0141833 A1 | 5/2019 | Hosoda et al. |
| 2021/0345485 A1 | 11/2021 | Komori et al. |

FOREIGN PATENT DOCUMENTS

| | | | |
|---|---|---|---|
| CN | 105462253 A | 4/2016 | |
| CN | 106664806 A | 5/2017 | |
| EP | 2 666 825 A | 11/2013 | |

(Continued)

OTHER PUBLICATIONS

International Search Report for PCT/JP2019/050635 dated Mar. 10, 2020 (PCT/ISA/210).
Office Action dated Apr. 11, 2023 from the Japanese Patent Office in counterpart JP Application No. 2022-063299.
International Preliminary Report on Patentability dated Jun. 16, 2021 with translation of the Written Opinion in International Application No.PCT/JP2019/050635.
(Continued)--